(12) United States Patent
Moriwaki et al.

(10) Patent No.: US 6,946,913 B2
(45) Date of Patent: Sep. 20, 2005

(54) HIGH FREQUENCY AMPLIFIER CIRCUIT

(75) Inventors: Takao Moriwaki, Tokyo (JP); Yuji Yamamoto, Hyogo (JP); Kosei Maemura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 10 days.

(21) Appl. No.: 10/756,504

(22) Filed: Jan. 14, 2004

(65) Prior Publication Data

US 2004/0251967 A1 Dec. 16, 2004

(30) Foreign Application Priority Data

May 13, 2003 (JP) ........................................ 2003-134939

(51) Int. Cl.[7] .............................................. H03F 3/04
(52) U.S. Cl. ...................................... 330/296; 330/285
(58) Field of Search ................................ 330/285, 296, 330/289, 295, 302, 303, 307

(56) References Cited

U.S. PATENT DOCUMENTS

| | | | | |
|---|---|---|---|---|
| 6,414,553 B1 | * | 7/2002 | Luo | 330/296 |
| 6,549,076 B2 | * | 4/2003 | Kuriyama | 330/296 |
| 6,556,082 B1 | * | 4/2003 | Wang et al. | 330/288 |
| 6,566,954 B2 | * | 5/2003 | Miyazawa | 330/285 |
| 6,690,237 B2 | * | 2/2004 | Miyazawa | 330/285 |
| 6,744,321 B2 | * | 6/2004 | Noh et al. | 330/296 |
| 6,806,775 B2 | * | 10/2004 | Abe | 330/297 |
| 6,882,227 B2 | * | 4/2005 | Barry et al. | 330/296 |
| 2001/0054933 A1 | * | 12/2001 | Miyazawa | 330/285 |

FOREIGN PATENT DOCUMENTS

JP          2002-009558          11/2002

* cited by examiner

*Primary Examiner*—Michael Tokar
*Assistant Examiner*—Linh V Nguyen
(74) *Attorney, Agent, or Firm*—Leydig, Voit & Mayer, Ltd.

(57) ABSTRACT

A high-frequency amplifier has an amplifying transistor and a bias circuit that supplies a bias current to the base of the amplifier transistor. The bias circuit has a reference voltage input terminal to which a reference voltage is input from an external source, a first transistor that supplies a bias current to the base of the amplifier transistor in response to the reference voltage, a second transistor whose collector is connected to the connecting point of the first transistor to the base of the amplifying transistor, and whose emitter is grounded, a third transistor that supplies a bias current to the base of the second transistor in response to the reference voltage, and temperature compensation portions connected between the connecting point of the control input terminal to the third transistor and the grounding point.

7 Claims, 2 Drawing Sheets

HIGH FREQUENCY AMPLIFIER CIRCUIT

BACKGROUND OF THE INVENTION

1. Field of the Invention

The present invention relates to a high-frequency amplifier comprising an amplifying transistor, and a bias circuit that supplies a bias current to the base of the amplifying transistor and having a temperature compensation function.

2. Background Art

In a high-frequency amplifier circuit of transmission power for a mobile phone, a bipolar transistor is used, and to the base thereof, a bias circuit for supplying a bias current is connected. Since small change in the properties of the high-frequency amplifier circuit due to temperature change is desired, the bias circuit is provided with a temperature compensation function.

FIG. 4 is a circuit diagram showing a conventional high-frequency amplifier circuit that has a bias circuit having a temperature compensation function. The conventional high-frequency amplifier circuit has an amplifier transistor 1 for amplifying high-frequency signals, and a bias circuit 2 for supplying a bias current to the base of the amplifier transistor 1.

Here, amplifier transistor 1 has a collector connected to an amplifier transistor collector power terminal 3, and an emitter connected to a grounding point. Bias circuit 2 also has a reference voltage input terminal 4 wherein a reference voltage is input from an external source, a first transistor 5, resistors 6 and 7, a first transistor connected as a diode (referred to here as a transistor diode) 8, and a second transistor diode 9.

The collector of the first transistor 5 is connected to a power terminal 10 for the bias circuit, the base thereof is the reference voltage input terminal 4 through the resistor 7, and the emitter thereof is connected to the base of the amplifier transistor 1.

The resistor 6 is connected between the connecting point of the emitter of the first transistor 5 to the base of the amplifier transistor 1 and the grounding point. The first transistor diode 8 and the second transistor diode 9 are serially connected to each other, and are connected between the connecting point of the base of the first transistor 5 to the resistor 7 and the grounding point.

The first transistor 5 and the resistor 6 constitute an emitter-follower circuit to be able to supply a sufficient base current to the amplifier transistor 1. The first transistor diode 8 and the second transistor diode 9, which constitute a temperature compensation unit, can compensate the temperature characteristics of the idle current Ic of the amplifier transistor 1. The level that can be compensated depends largely on the supplied reference voltage, and the higher the reference voltage, the smaller change in the idle current Ic due to temperature change.

If AlGaAs HBTs (hetero-junction bipolar transistors) having a forward base-emitter voltage of about 1.2 volts are used as the first transistor diode 8 and the second transistor diode 9, the base voltage of the first transistor 5 becomes about 2.4 volts. In general, a voltage of 3 volts is used as the reference voltage.

In order to reduce change in the idle current of the amplifier transistor 1 due to temperature change, the current of the first transistor 5 must be constant regardless of change in the base voltage V1 of the first transistor 5 due to temperature change. It is important for this to make the current of the first transistor 5 constant; that is, it is important to make the current flowing in the resistor 7 constant regardless of change in V1. In this case, since the current flowing in the resistor 7 is in proportion to the potential difference between the reference voltage and V1, it is required to raise the reference voltage as high as possible (3 volts or more). Thereby, mobile phones had problems that made low-voltage operation difficult, increased the number of parts, and increased consumed current.

The conventional high-frequency amplifier circuit had also a problem that change in the impedance of the bias circuit 2 viewed from the amplifier transistor 1 significantly affected the high-frequency characteristics of the high-frequency amplifier circuit. Especially, in a high-frequency amplifier circuit used in CDMA modulation and the like that require a high linearity, change in the impedance of the bias circuit must be small relative to the change in the operation of the bias circuit 2 due to change in the reference voltage. There was also another problem that the accuracy of the reference voltage of about ±1% was required to minimize the fluctuation of the idle current of the amplifier transistor 1.

There was another problem that the properties of the high-frequency amplifier circuit, such as distortion and noise power in Rx band, were deteriorated by the effect of low-frequency impedance.

To solve the above-described problems, the first object of the present invention is to provide a high-frequency amplifier circuit that can compensate change in the idle current of the amplifier transistor due to temperature change without raising the reference voltage, and can avoid the unstable operation of high-frequency signals due to feedback or the like. The second object of the present invention is to provide a high-frequency amplifier circuit that can minimize change in impedance of the bias circuit due to change in the operations, and can minimize the fluctuation of the idle current of the amplifier transistor due to the fluctuation of the reference voltage. The third object of the present invention is to provide a high-frequency amplifier circuit that can improve the properties of the high-frequency amplifier circuit, such as distortion and noise power in Rx band.

SUMMARY OF THE INVENTION

According to one aspect of the present invention, a high-frequency amplifier has an amplifier transistor 1 and a bias circuit 20 that supplies a bias current to the base of the amplifier transistor 1. The bias circuit 20 has a reference voltage input terminal 4 whereto a reference voltage is inputted from an external source, a first transistor 5 that supplies a bias current to the base of the amplifier transistor 1 in response to the reference voltage, a second transistor 23 whose collector is connected to the connecting point of the first transistor 5 to the base of the amplifier transistor 1, and whose emitter is grounded, a third transistor 24 that supplies a bias current to the base of the second transistor 23 in response to the reference voltage, and temperature compensation portions 8 and 9 provided between the connecting point of the control input terminal to the third transistor 24 and the grounding point.

Other and further objects, features and advantages of the invention will appear more fully from the following description.

DETAILED DESCRIPTION OF THE PREFERRED EMBODIMENTS

First Embodiment

Figure 1:
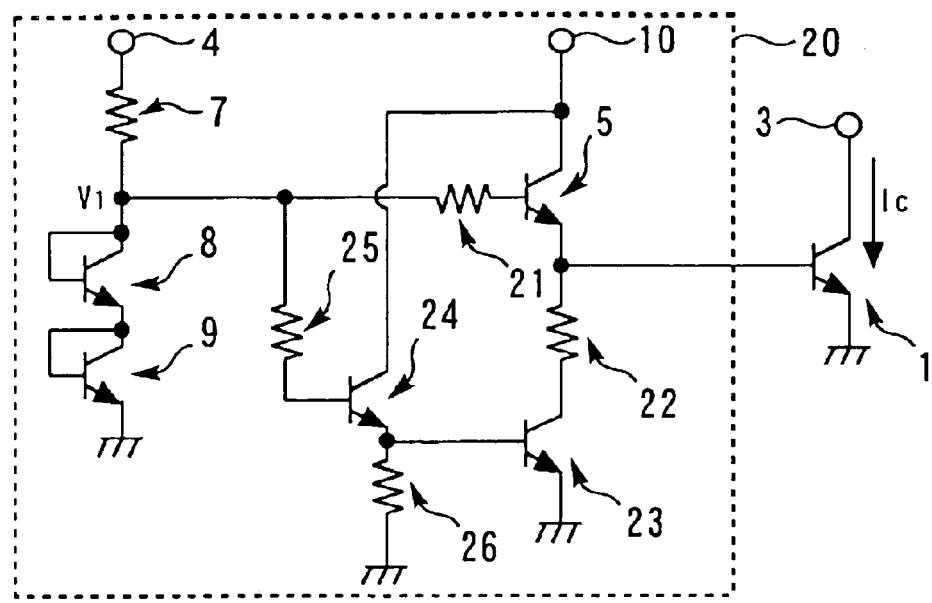
FIG. 1 is a circuit diagram showing a high-frequency amplifier circuit according to the first embodiment of the present invention.
Figure 4:
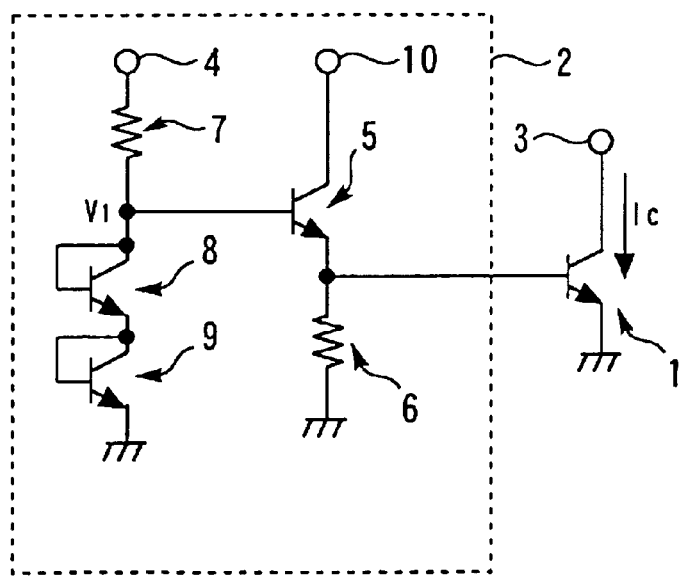
FIG. 4 is a circuit diagram showing a conventional high-frequency amplifier circuit that has a bias circuit having a temperature compensation function.

FIG. 1 is a circuit diagram showing a high-frequency amplifier circuit according to the first embodiment of the present invention. The constituting elements same as in FIG. 4 will be denoted by the same reference numerals, and the detailed description thereof will be omitted. The high-frequency amplifier circuit of the first embodiment has an amplifier transistor 1, and a bias circuit 20 for supplying a bias current to the base of the amplifier transistor 1.

The bias circuit 20 has a reference voltage input terminal 4, a first transistor 5, resistors 7, 21, 22, 25, and 26, a first transistor diode 8, a second transistor diode 9, a second transistor 23, and a third transistor 24.

Here, the collector, the base, and the emitter of the first transistor 5 are connected to a power terminal 10 for the bias circuit, to a reference voltage input terminal 4 through resistors 21 and 7, and to the base of the amplifier transistor 1, respectively. Thereby, the first transistor 5 supplies a bias current in response to the reference voltage to the base of the amplifier transistor 1.

The collector of the second transistor 23 is connected to the connecting point of the first transistor 5 to the base of the amplifier transistor 1, and the emitter thereof is grounded. A resistor 22 is connected between the connecting point of the first transistor 5 to the amplifier transistor 1 and the collector of the second transistor 23.

The collector, the base, and the emitter of the third transistor 24 are connected to the power terminal 10 for the bias circuit, to the reference voltage input terminal 4 through resistors 25 and 7, and to the base of the second transistor 23, respectively. The resistor 25 is connected between the emitter of the third transistor 24 and the grounding point. Thereby, the third transistor 24 supplies a bias current in response to the reference voltage to the base of the second transistor 23.

The first transistor diode 8 and the second transistor diode 9, which constitute a temperature compensation unit, are connected between the connecting point of the reference voltage input terminal 4 to the third transistor 24 (the connecting point of the resistor 7 to the resistor 25) and the grounding point.

As described above, in addition to the first transistor diode 8 and the second transistor diode 9, which constitute a temperature compensation unit, the high-frequency amplifier circuit of the first embodiment has the second transistor 23, which is the temperature compensation transistor. The temperature compensation function of the second transistor 23 will be described below.

First, at a low temperature, the collector current of the third transistor 24 decreases, and the current flowing in the resistor 26 also decreases. Therefore, the base voltage of the second transistor 23 lowers, to decrease the collector current thereof. Then, the base-emitter voltage of the first transistor 5 lowers, and the bias voltage outputted from the bias circuit 20 becomes higher than the bias voltage outputted from the conventional bias circuit 2 shown in FIG. 4, to compensate the change of the threshold voltage of the amplifier transistor, which otherwise elevates at a low temperature.

On the other hand, at a high temperature, the collector current of the second transistor 23 tends to increase. Then, the base-emitter voltage of the first transistor 5 elevates, and the bias voltage outputted from the bias circuit 20 becomes lower than the bias voltage outputted from the conventional bias circuit 2 shown in FIG. 4, to compensate the change of the threshold voltage of the amplifier transistor, which otherwise lowers at a high temperature.

Thus, the high-frequency amplifier circuit of the first embodiment can compensate change in the idle current of the amplifier transistor 1 due to temperature change without elevating the reference voltage.

In the high-frequency amplifier circuit of the first embodiment, the third transistor 24, which is an emitter follower generating the base bias of the second transistor 23 is constituted separately from the temperature compensation unit. Therefore, the operation of the second transistor 23, which is a temperature compensation transistor, is not directly affected by the current flowing in the temperature compensation unit, and unstable operations due to the feedback of high-frequency signals and the like can be avoided.

The high-frequency amplifier circuit of the first embodiment has the resistor 22 between the connecting point of the first transistor 5 to the base of the amplifier transistor 1, and the collector of the second transistor 23. By increasing the resistance value of the resistor 22, change in the impedance of the resistor 22 side of the bias circuit 20 viewed from the amplifier transistor 1 can be reduced even if the operating current of the second transistor 23 changes due to temperature change.

When the reference voltage supplied to the reference voltage input terminal 4 changes, the collector current flows in the second transistor 23 in response to the reference voltage, and the base-emitter voltage of the first transistor 5 changes, to compensate change in the reference voltage, and minimize change in the output voltage of the bias circuit 20. Thereby, the fluctuation of the idle current of the amplifier transistor due to the fluctuation of the reference voltage can be minimized. When the reference voltage changes, the collector current of the second transistor 23 changes; however, by connecting the resistor 22, change in the impedance of the bias circuit 20 viewed from the amplifier transistor 1 can be reduced.

Second Embodiment

Figure 2:
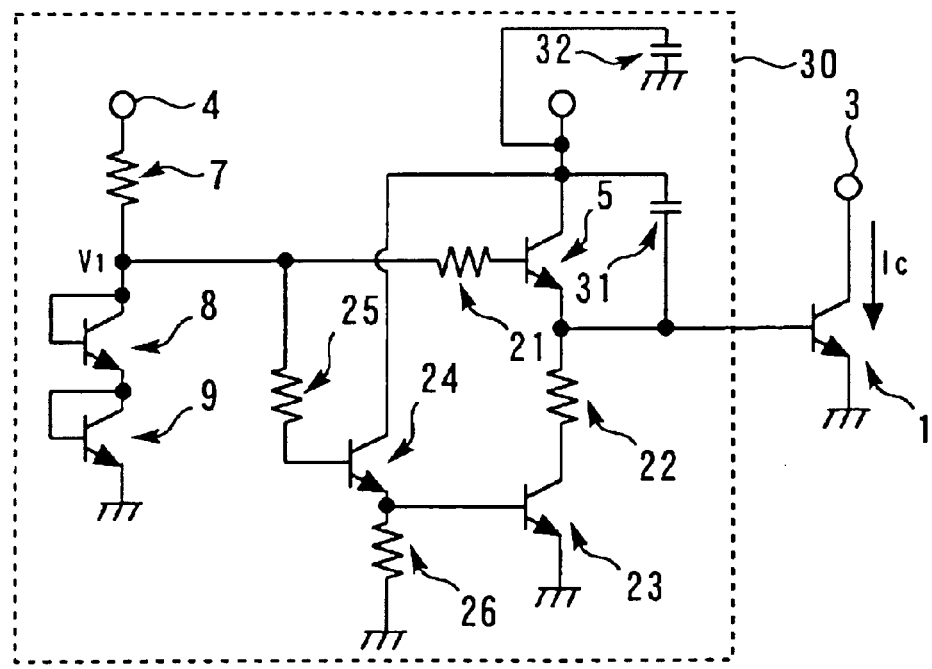
FIG. 2 is a circuit diagram showing a high-frequency amplifier circuit according to the second embodiment of the present invention.

FIG. 2 is a circuit diagram showing a high-frequency amplifier circuit according to the second embodiment of the present invention. The constituting elements same as in FIG. 1 will be denoted by the same reference numerals, and the detailed description thereof will be omitted. The high-frequency amplifier circuit of the second embodiment has an amplifier transistor 1, and a bias circuit 30 for supplying a bias current to the base of the amplifier transistor 1.

In addition to the constituting elements of the bias circuit 20 in the first embodiment, the bias circuit 30 further has a first capacitor 31 connected between the collector and the emitter of the first transistor 5, and a second capacitor 32 connected between the collector of the first transistor 5 and the grounding point.

By selecting the capacity of the first capacitor 31 and the second capacitor 32 to be appropriate values, the impedance of the bias circuit 30 viewed from the amplifier transistor 1 can be feigned to be short-circuiting for a desired frequency. Here, the impedance of a low frequency significantly affects the properties of the high-frequency amplifier circuit, such as distortion and receiving zone noise. Therefore, in order to feign the impedance of a low frequency to be short-circuiting, a large capacity of about 1,000 pF is selected as the capacity of the first capacitor 31 and the second capacitor 32. Thereby, the properties of the high-frequency amplifier circuit, such as distortion and receiving zone noise can be improved.

Third Embodiment

Figure 3:
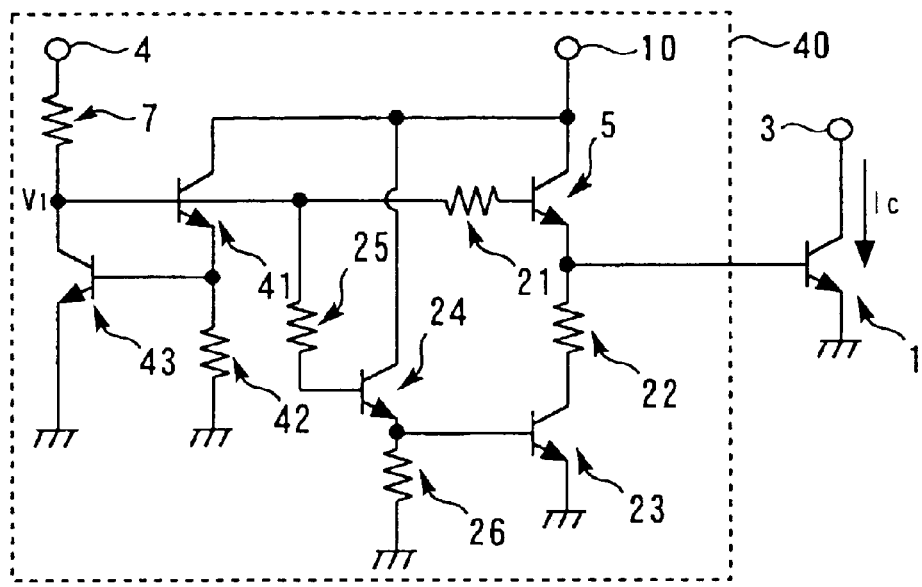
FIG. 3 is a circuit diagram showing a high-frequency amplifier circuit according to the third embodiment of the present invention.

FIG. 3 is a circuit diagram showing a high-frequency amplifier circuit according to the third embodiment of the present invention. The constituting elements same as in FIG. 1 will be denoted by the same reference numerals, and the detailed description thereof will be omitted. The high-frequency amplifier circuit of the third embodiment has an amplifier transistor 1, and a bias circuit 40 for supplying a bias current to the base of the amplifier transistor 1.

The bias circuit 40 has a fourth transistor 41, a resistor 42, and a fifth transistor 43 in place of the first transistor diode 8 and the second transistor diode 9 among the constituting elements of the bias circuit 20 in the first embodiment.

Here, the collector of the fourth transistor 41 is connected to a source terminal 10 for the bias circuit, the base thereof is connected to a reference voltage input terminal 4 through a resistor 7, and the emitter thereof is grounded through the resistor 42. The collector of the fifth transistor 43 is connected to a reference voltage input terminal 4 through a resistor 7, the base thereof is connected to the connecting point of the fourth transistor 41 and the resistor 42, and the emitter thereof is grounded.

Thus, the temperature compensation unit is constituted of a current mirror circuit consisting of the fourth transistor 41 and the fifth transistor 43. Thereby, the compensation level for temperature is elevated compared with the temperature compensation portion constituted of a transistor diode as in the first embodiment, and the temperature characteristics are further improved.

Although the case of the one-stage amplifier transistor is described in the above-described embodiments 1 to 3, the present invention can also be applied to a multi-stage high-frequency amplifier circuit. The amplifier transistor and the bias circuit may be constituted on the same chip, or may be constituted on different chips to achieve the same effect.

The features and advantages of the present invention may be summarized as follows.

As described above, change in the idle current of the amplifier transistor due to temperature change can be compensated, and unstable operation due to the feedback of high-frequency signals or the like can be avoided without raising the reference voltage.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-134939, filed on May 13, 2003 including specification, claims, drawings and summary, on which the Convention priority of the present application is based, are incorporated herein by reference in its entirety.

What is claimed is:

1. An amplifier comprising:
an amplifying transistor having a base; and
a bias circuit that supplies a bias current to the base of the amplifying transistor, wherein the bias circuit includes:
  a reference voltage input terminal to which a reference voltage is input from an external source;
  a first transistor having an emitter and a collector and that supplies a bias current to the base of the amplifying transistor in response to the reference voltage;
  a second transistor having a base, a collector connected to the base of the amplifying transistor, and an emitter that is grounded;
  a third transistor having an emitter connected to the base of the second transistor and supplying a bias current to the second transistor in response to the reference voltage; and
  a temperature compensation section connected between the reference voltage input terminal and the ground and connected to the third transistor.

2. An amplifier comprising:
an amplifying transistor having a base; and
a bias circuit that supplies a bias current to the base of the amplifying transistor, wherein the bias circuit includes:
  a reference voltage input terminal to which a reference voltage is input from an external source;
  a first transistor having an emitter and a collector and that supplies a bias current to the base of the amplifying transistor in response to the reference voltage;
  a second transistor having a base, a collector connected to the base of the amplifying transistor, and an emitter that is grounded;
  a resistor having a first end connected to the emitter of the first transistor and a second end connected to the collector of the second transistor;
  a third transistor that supplies a bias current to the base of the second transistor in response to the reference voltage; and
  a temperature compensation section connected between the reference voltage input terminal and the ground and connected to the third transistor.

3. An amplifier comprising:
an amplifying transistor having a base; and
a bias circuit that supplies a bias current to the base of the amplifying transistor, wherein the bias circuit includes:
  a reference voltage input terminal to which a reference voltage is input from an external source;
  a first transistor having an emitter and a collector and that supplies a bias current to the base of the amplifying transistor in response to the reference voltage;
  a first capacitor connected between the collector and the emitter of the first transistor;
  a second capacitor connected between the collector of the first transistor and ground;
  a second transistor having a base, a collector connected to the base of the amplifying transistor, and an emitter that is grounded;
  a third transistor that supplies a bias current to the base of the second transistor in response to the reference voltage; and
  a temperature compensation section connected between the reference voltage input terminal and the around and connected to the third transistor.

4. The amplifier according to claim 1 further comprising a resistor having a first end connected to the emitter of the first transistor and a second end connected to the collector of the second transistor.

5. The amplifier according to claim 1 further comprising:

a first capacitor connected between the collector and the emitter of the first transistor; and a second capacitor connected between the collector of the first transistor and ground.

6. The amplifier according to claim 4 further comprising:

a first capacitor connected between the collector and the emitter of the first transistor; and a second capacitor connected between the collector of the first transistor and ground.

7. The amplifier according to claim 2 further comprising:

a first capacitor connected between the collector and the emitter of the first transistor; and a second capacitor connected between the collector of the first transistor and ground.

* * * * *